(12) United States Patent
Elbanhawy et al.

(10) Patent No.: US 7,656,024 B2
(45) Date of Patent: Feb. 2, 2010

(54) CHIP MODULE FOR COMPLETE POWER TRAIN

(75) Inventors: Alan Elbanhawy, Hollister, CA (US); Benny Tjia, San Francisco, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 158 days.

(21) Appl. No.: 11/427,906

(22) Filed: Jun. 30, 2006

(65) Prior Publication Data

US 2008/0001279 A1    Jan. 3, 2008

(51) Int. Cl.
*H01L 23/10* (2006.01)
*H01L 29/00* (2006.01)
*H01L 23/34* (2006.01)

(52) U.S. Cl. .............. 257/707; 257/531; 257/723; 257/778

(58) Field of Classification Search ............ 257/379, 257/531, 532, 536, 706, 707, 712, 713, 723, 257/724, 778, 480, 780, E25.013, E25.021, 257/E25.027

See application file for complete search history.

(56) References Cited

U.S. PATENT DOCUMENTS

| | | | |
|---|---|---|---|
| 4,680,613 A | 7/1987 | Daniels et al. | |
| 4,720,396 A | 1/1988 | Wiid | |
| 4,731,701 A | 3/1988 | Kuo et al. | |
| 4,751,199 A | 6/1988 | Phy | |
| 4,772,935 A | 9/1988 | Lawler et al. | |
| 4,791,473 A | 12/1988 | Phy | |
| 4,796,080 A | 1/1989 | Phy | |
| 4,839,717 A | 6/1989 | Phy et al. | |
| 4,890,153 A | 12/1989 | Wu | |
| 5,327,325 A | 7/1994 | Nicewarner, Jr. | |
| 5,646,446 A | 7/1997 | Nicewarner, Jr. et al. | |
| 5,776,797 A | 7/1998 | Nicewarner, Jr. et al. | |
| 6,133,634 A | 10/2000 | Joshi | |
| 6,278,264 B1 * | 8/2001 | Burstein et al. | 323/282 |
| 6,329,706 B1 | 12/2001 | Nam | |
| 6,424,035 B1 | 7/2002 | Sapp et al. | |
| 6,432,750 B2 | 8/2002 | Jeon et al. | |
| 6,449,174 B1 | 9/2002 | Elbanhawy | |
| 6,489,678 B1 | 12/2002 | Joshi | |
| 6,556,750 B2 | 4/2003 | Constantino et al. | |
| 6,566,749 B1 | 5/2003 | Joshi et al. | |
| 6,574,107 B2 | 6/2003 | Jeon et al. | |
| 6,611,434 B1 * | 8/2003 | Lo et al. | 361/760 |
| 6,621,152 B2 | 9/2003 | Choi et al. | |
| 6,627,991 B1 | 9/2003 | Joshi | |
| 6,642,738 B2 | 11/2003 | Elbanhawy | |
| 6,645,791 B2 | 11/2003 | Noquil et al. | |
| 6,674,157 B2 | 1/2004 | Lang | |

(Continued)

OTHER PUBLICATIONS

U.S. Appl. No. 11/335,366, Elbanhawy et al.
U.S. Appl. No. 11/471,291, Jeon et al.

*Primary Examiner*—Hung Vu
(74) *Attorney, Agent, or Firm*—Townsend and Townsend and Crew LLP

(57) ABSTRACT

A chip module is disclosed. It includes a circuit substrate, a semiconductor die comprising a power transistor mounted on the circuit substrate, and a passive electronic component. The passive electronic component is in electrical communication with the semiconductor die, and is in thermal communication with the semiconductor die.

19 Claims, 4 Drawing Sheets

U.S. PATENT DOCUMENTS

| | | |
|---|---|---|
| 6,683,375 B2 | 1/2004 | Joshi et al. |
| 6,696,321 B2 | 2/2004 | Joshi |
| 6,720,642 B1 | 4/2004 | Joshi et al. |
| 6,731,003 B2 | 5/2004 | Joshi et al. |
| 6,740,541 B2 | 5/2004 | Rajeev |
| 6,756,689 B2 | 6/2004 | Nam et al. |
| 6,774,465 B2 | 8/2004 | Lee et al. |
| 6,777,800 B2 | 8/2004 | Madrid et al. |
| 6,806,580 B2 | 10/2004 | Joshi et al. |
| 6,830,959 B2 | 12/2004 | Estacio |
| 6,836,023 B2 | 12/2004 | Joshi et al. |
| 6,867,481 B2 | 3/2005 | Joshi et al. |
| 6,867,489 B1 | 3/2005 | Estacio |
| 6,891,256 B2 | 5/2005 | Joshi et al. |
| 6,891,257 B2 | 5/2005 | Chong et al. |
| 6,893,901 B2 | 5/2005 | Madrid |
| 6,943,434 B2 | 9/2005 | Tangpuz et al. |
| 6,949,822 B2 * | 9/2005 | Shivkumar et al. .......... 257/704 |
| 6,989,588 B2 | 1/2006 | Quinones et al. |
| 6,992,384 B2 | 1/2006 | Joshi |
| 7,022,548 B2 | 4/2006 | Joshi et al. |
| 7,023,077 B2 | 4/2006 | Madrid |
| 7,061,077 B2 | 6/2006 | Joshi |
| 7,061,080 B2 | 6/2006 | Jeun et al. |
| 7,081,666 B2 | 7/2006 | Joshi et al. |
| 2004/0238857 A1 * | 12/2004 | Beroz et al. ................. 257/232 |
| 2006/0055027 A1 * | 3/2006 | Kitabatake et al. .......... 257/706 |

* cited by examiner

CHIP MODULE FOR COMPLETE POWER TRAIN

CROSS-REFERENCES TO RELATED APPLICATIONS

NOT APPLICABLE

BACKGROUND OF THE INVENTION

Power modules are commercially available. Although such power modules are effective, a number of improvements could be made. For instance, it would desirable to reduce the footprint of conventional modules. Conventional power modules contain a number of electronic components including power MOSFETs (metal oxide semiconductor field effect transistors), control integrated circuits (IC's), capacitors, resistors, and inductors. As the demand for smaller, and more functional, electronic devices increases, there is a need to reduce the footprint and overall size of such power modules.

In addition, conventional power modules contain power transistors. A power transistor can generate a significant amount of heat, and the power transistor's operating range can depend on its ability to dissipate heat. While improved heat dissipation can be achieved by attaching a finned heat sink to the power transistor, heat sinks are expensive and bulky. Adding a large, finned heat sink to a power module would increase the size and the cost of the power module.

It would be desirable to provide for an improved chip module which can integrate components for a power converter (or other type of electrical application). The space occupied by the chip module would be minimized, and the chip module would have better heat dissipation properties and power density properties than conventional power modules.

Embodiments of the invention address these and other problems, individually and collectively.

BRIEF SUMMARY OF THE INVENTION

Embodiments of the invention are directed to chip modules, methods for forming the chip modules, and electrical assemblies including the chip modules.

One embodiment of the invention is directed to a chip module. The chip module includes a circuit substrate, a semiconductor die comprising a power transistor mounted on the circuit substrate, and a passive electronic component in electrical communication with the semiconductor die. The passive electronic component may be an inductor with a coil, and may be in thermal communication with the semiconductor die. The passive electronic component can be stacked on top of the power transistor so that the passive electronic component can both serve as a heat sink and an electrical component in the power module. By providing this arrangement, the space occupied by the chip module is minimized. In addition, the heat dissipation and the power density properties of the chip module are improved over conventional power modules.

Another embodiment of the invention is directed to a method for forming a chip module. The method includes obtaining a circuit substrate, mounting a semiconductor die comprising a power transistor on the circuit substrate, and electrically coupling a passive electronic component to the semiconductor die. The electrically coupled passive electronic component is in thermal communication with the semiconductor die, and can serve as a heat sink for the power transistor.

Another embodiment of the invention is directed to a chip module. The chip module includes a circuit substrate, a semiconductor die mounted on the circuit substrate, and an electronic component comprising a coil stacked on the semiconductor die. The electronic component is in electrical and thermal communication with the semiconductor die. The coil can serve as a heat sink for the power transistor.

Other embodiments of the invention are directed to electrical assemblies including the above-described chip modules.

These and other embodiments of the invention are described in further detail below with reference to the Figures and the Detailed Description.

BRIEF DESCRIPTION OF THE DRAWINGS

In the Figures, like numerals designate like elements. In addition, in the Figures, some components may not be drawn to scale. Some components may be shown as being larger than other components for ease of illustration.

DETAILED DESCRIPTION

A chip module according to an embodiment of the invention can include a number of electrical components. The electrical components may form a substantial part of, or may constitute an entire electrical system. For instance, a power train in a synchronous buck converter can be integrated into a single module. For example, a chip module according to an embodiment of the invention may include BGA (ball grid array) MOSFET packages, a driver (or controller IC or controller system), an inductor, resistors, and capacitors (e.g., bypass capacitors and a bootstrap capacitor).

In the exemplary chip module, the chip module may have lateral dimensions that are substantially equal to the lateral dimensions of the inductor, and may be only slightly taller than the height of the inductor. The inductor can serve as a heat sink for the MOSFETs in the chip module, while also serving as a functioning electrical component in the buck converter.

As used herein, the term "chip module" or "module" may refer to a single discrete collection of electrical components that can be mounted to a motherboard or the like.

Figure 1:
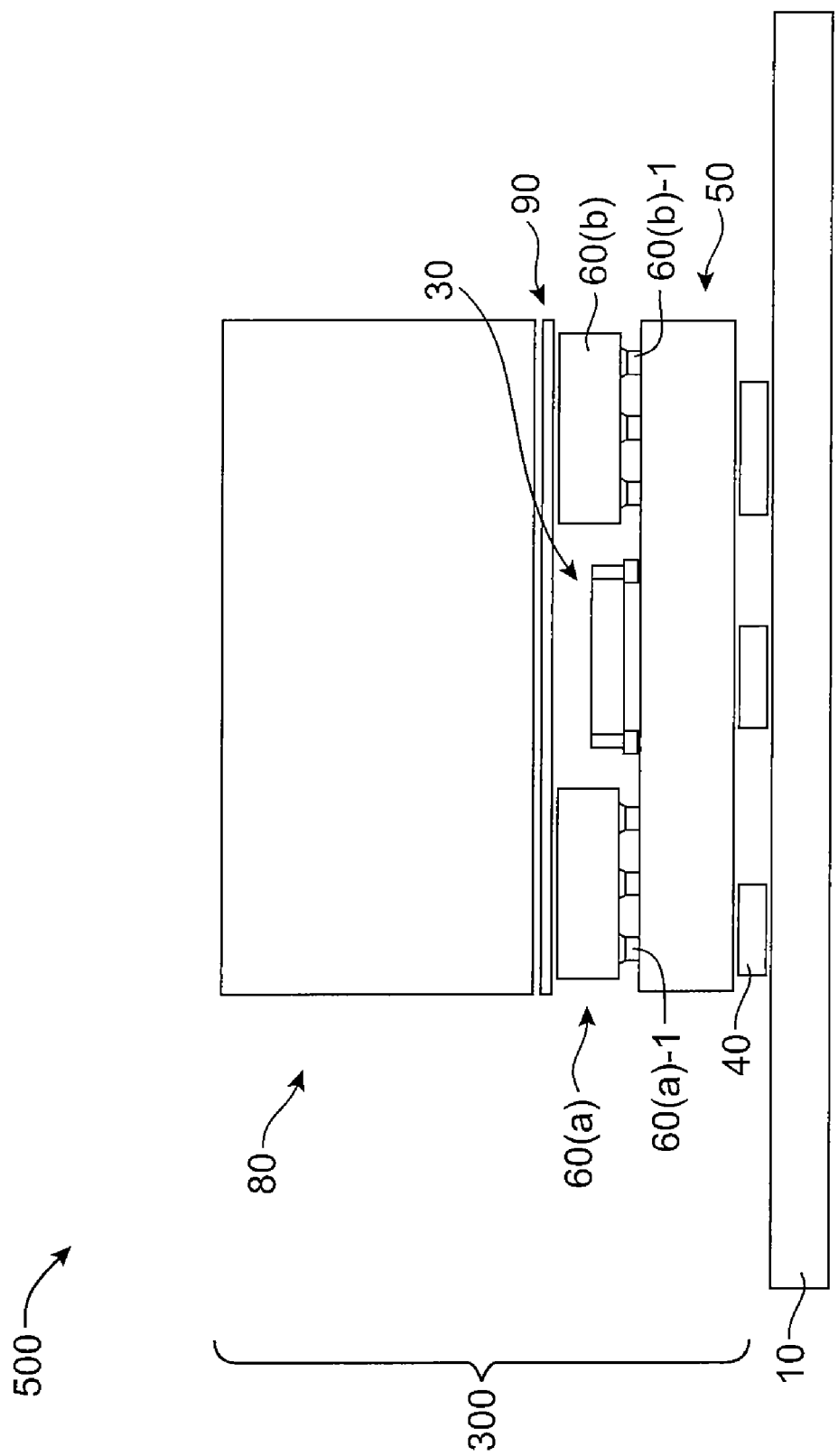
FIG. 1 shows a side view of a chip module according to an embodiment of the invention mounted on a motherboard.

FIG. 1 shows an electrical assembly 500 including a chip module 300 mounted on a motherboard 10. The motherboard 10 may be a standard printed circuit board or the like.

The chip module 300 may form at least part of a more complicated system such as a synchronous buck converter. Although synchronous buck converters are described in detail in this application, embodiments of the invention may be used for other electrical applications and are not limited to synchronous buck converters. The electrical assemblies according to embodiments of the invention can also be used with any number of electrical apparatuses including personal computers, servers, mobile computing and communication devices, etc.

In FIG. 1, one chip module 300 is shown for simplicity of illustration. It is understood, however, that other modules and devices (not shown) may also be mounted on the motherboard 10 to form other types of electrical assemblies.

The chip module 300 shown in FIG. 1 includes a multilayer circuit substrate 50, which may have one or more chip packages 60(a), 60(b), and one or more passive components 30 mounted on it. As shown in FIG. 1, the chip packages 60(a),

60(b) may contain solder structures 60(a)-1, 60(b)-1 (e.g., a first set of solder structures) that allow them to be connected to a first surface of the substrate 50. A resilient insulating layer 90 is positioned over the chip packages 60(a), 60(b) and the one or more passive components 30.

An inductor 80 is on the resilient insulating layer 90. In this example, the inductor 80 may include an outer casing and a coil (not shown) disposed within the outer casing. The coil is electrically coupled to the multilayer circuit substrate 50 (and therefore the die packages 60(a), 60(b)) using electrical connectors such as wires, pins, or the like. Such electrical connectors are described in further detail below with reference to FIG. 4.

Referring again to FIG. 1, additional solder structures 40 (e.g., a second set of solder structures) are under and in contact with a second surface of the multilayer circuit substrate 50. They electrically and mechanically connect the multilayer circuit substrate 50 to the motherboard 10. In other embodiments, other types of electrical connectors (e.g., pins, conductive columns, etc.) may be used instead of or in addition to the solder structures 40.

The solder structures 40 may or may not be included in the chip module 300. For example, the solder structures 40 could be present under the circuit substrate 50 and may be on a second surface of the substrate 50 prior to mounting on the motherboard 10, and may therefore form part of the chip module 300. Alternatively, the solder structures 40 could be present on the motherboard 10 prior to mounting the chip module 300 on the motherboard 10, and may therefore not necessarily be part of the chip module 300.

Each part of the chip module 300 is described in further detail below.

The multilayer circuit substrate 50 may comprise any suitable number of insulating and conducting layers. In some embodiments, the multilayer circuit substrate 50 may be a printed circuit board (PCB) made using conventional PCB manufacturing methods.

A number of electrical components are mounted on the multilayer circuit substrate 50. The electrical components may be packaged or unpackaged, and may include active devices such as power transistors (e.g., power MOSFETs) and/or one or more passive components including passive devices such as capacitors.

As used herein, the term "active device" or "active component" includes a device or component which, when subjected to a current or voltage, exhibits either gain (amplification) and/or control characteristics, or a device which converts input signal energy into output signal energy through interaction with the energy from an auxiliary source(s). The term "passive device" includes devices such as resistors or capacitors, which have no amplification or control characteristics.

In FIG. 1, two or more semiconductor die packages 60(a), 60(b) may be mounted on the circuit substrate 50. The semiconductor die packages 60(a), 60(b) may include any suitable combination of power transistor die packages, controller IC packages, etc. The semiconductor die packages 60(a), 60(b) may respectively comprise first and second dies in this example. Although two die packages 60(a), 60(b) are shown in this example, in other embodiments, there may be only one die package or more than two die packages.

The power transistor packages may include semiconductor dies including vertical power transistors. Exemplary vertical power transistors are described, for example, in U.S. Pat. Nos. 6,274,905, and 6,351,018, both of which are assigned to the same assignee as the present application, and both which are herein incorporated by reference in their entirety for all purposes. Vertical power transistors include VDMOS transistors. A VDMOS transistor is a MOSFET that has two or more semiconductor regions formed by diffusion. It has a source region, a drain region, and a gate. The device is vertical in that the source region and the drain region are at opposite surfaces of the semiconductor die. The gate may be a trenched gate structure or a planar gate structure, and is formed at the same surface as the source region. Trenched gate structures are preferred, since trenched gate structures are narrower and occupy less space than planar gate structures. During operation, the current flow from the source region to the drain region in a VDMOS device is substantially perpendicular to the die surfaces. In other embodiments, other types of transistors such as horizontal transistors may be used. In a horizontal transistor, current flows horizontally within a die from a source region to a drain region.

The power transistor packages are preferably BGA (or ball grid array) type packages. BGA packages, and other non-leaded packages, are preferred, since they are compact, and minimize stray capacitances and inductances, as they provide for a more direct connection to an underlying circuit substrate (as compared to a leaded chip package with a molded housing). BGA type packages may use semiconductor dies with vertical or horizontal power transistors.

Figure 2:
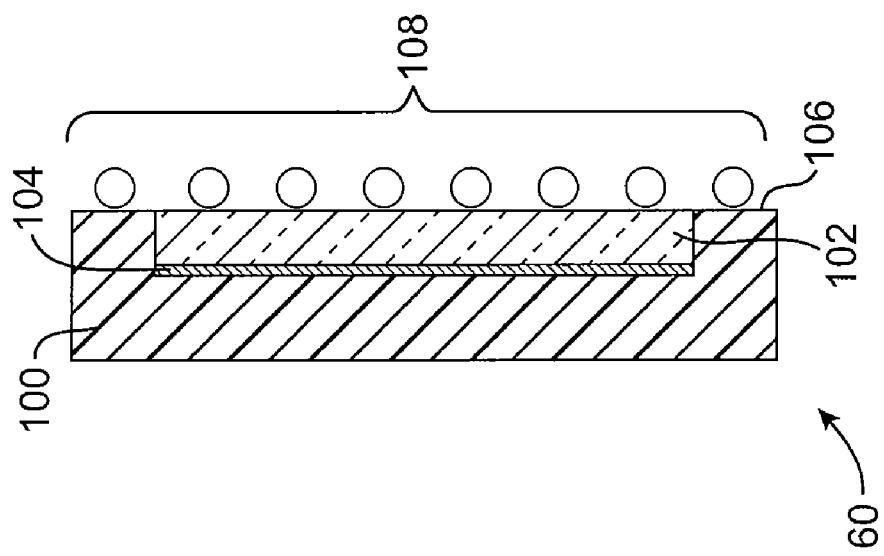
FIG. 2 shows a side, cross-sectional view of a BGA-type semiconductor die package.

A side-cross-sectional view of an exemplary BGA type package is shown in FIG. 2. As shown in FIG. 2, the semiconductor die package 60 may have a conductive carrier 100, which may be in the form of a cup. The conductive carrier 100 includes peripheral raised edge regions including edge surfaces 106, wherein the edge regions and bottom portion define a cavity. The conductive carrier 100 may be made from copper, aluminum, or any other suitable electrically and thermally conductive material. In other embodiments, the carrier could be in the form of a conductive clip with one or two legs, or even conical bumps.

Referring to FIG. 2, a semiconductor die 102 is disposed within the cavity and a front surface of the semiconductor die 102 is substantially coplanar with edge region surfaces 106 of the carrier 100. A die attach material 104 (e.g., solder) is used to attach the back surface of the die 102 to the bottom of the cavity defined in the carrier 100.

Figure 3:
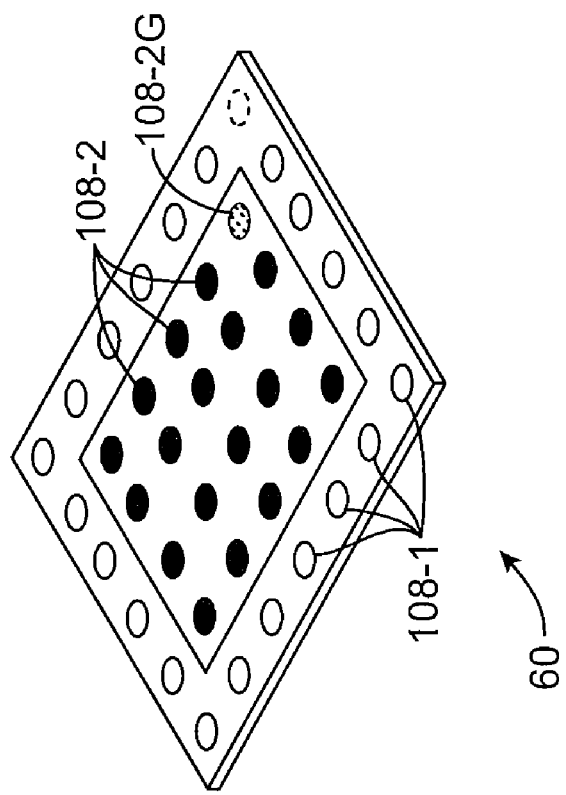
FIG. 3 shows a top perspective view of the semiconductor die package shown in FIG. 2.

An array of solder structures 108 (e.g., solder balls) is on the front surface of the die 102 and on the edge region surfaces 106. As shown in FIG. 3, the array of solder structures 108 can include a gate solder structure 108-2G, a plurality of source solder structures 108-2, and a plurality of drain solder structures 108-1. The drain solder structures 108-1 surround the source solder structures 108-2 and the gate solder structure 108-2G. Also, the drain solder structures 108-1 are electrically connected to a drain terminal at the back surface of the die 102, through the carrier 100. The source and gate solder structures 108-2 and 108-2G respectively connect to source and gate terminals at the front surface of the die 102.

It is apparent from FIG. 3, that the BGA-type package can be "flipped" like a flip chip and then mounted to a printed circuit board or the like. The BGA type package has a thin profile and is compact. Heat can be dissipated from the die 102 through the carrier 100, and to an external heat dissipating structure (e.g., to the above-described inductor) or to the external environment.

Although BGA type packages are preferred, other types of semiconductor die packages can also be used. Such packages may include MLP type packages, or other low-profile power semiconductor packages. Such packages may be leaded or leadless. Also, as an alternative to the embodiment shown in FIG. 3, the carrier 100 may have outward flanges whereby the edge surfaces 106 would extend outward with a peripheral flange region (not shown).

Referring again to FIG. 1, one or more passive components 30 may also be mounted to the circuit substrate 50, along with the packaged dies 60(a), 60(b). Exemplary passive components may include passive devices such as resistors, capacitors, and the like.

An optional resilient insulating layer 90 is present on the semiconductor die packages 60(a), 60(b). The insulating layer 90 may be in the form of a single layer and is thermally conductive, but may be electrical insulating, and/or may have elastomeric properties. It may comprise a polymeric, resilient material filled with thermally conductive fillers. A preferred insulating layer material is commercially available and is sold under the tradename Silpad™ by the Bergquist Company. The resilient insulating layer 90 may be preformed and conforms to the slightly uneven topography created by the various components mounted on the circuit substrate 50. In other embodiments, instead of using a preformed layer, it may be possible to deposit a thermally conductive and insulating material on the die packages 60(a), 60(b), and thereafter cure it to solidify it.

An inductor 80 is present on the insulating layer 90. The inductor 80 may include a coil of wire with a ferrite or iron powder core. The inductor 80 is in thermal communication with the power semiconductor die packages 60(a), 60(b), through the thermally conductive insulating layer 90, so that heat generated by the dies in the die packages 60(a), 60(b) is dissipated through the inductor 80. In this example, the thermally conductive insulating layer 90 is in contact with both the die packages 60(a), 60(b) and the inductor 80. This maximizes the transfer of heat from the die packages 60(a), 60(b) to the inductor 80. In some cases, during operation, the temperature of the die packages 60(a), 60(b) can be about the same (e.g., less than about 5° C. temperature difference) as the temperature of the inductor 80 so that heat is transferred as efficiently as possible.

Although a single inductor 80 is described in detail, it is understood that any other relatively large, passive electronic component may be stacked on the die packages 60(a), 60(b). For example, transformer coils and like are relatively large and have good thermal dissipation properties, so electronic components such as these may also be stacked on the die packages 60(a), 60(b).

Compared to the semiconductor die packages 60(a), 60(b), inductors are relatively large components that have good thermal conduction properties. By stacking the inductor 80 on top of the heat-generating semiconductor die packages 60(a), 60(b), these electrical components are arranged in the most space-efficient configuration, while also efficiently using the heat transfer properties of the inductor 80. Because heat is dissipated more effectively, it is possible to push the power transistors in the power semiconductor die packages 60(a), 60(b) to higher performance levels than they would otherwise be able to achieve. For example, by removing more heat from the semiconductor die packages 60(a), 60(b), more current can be run through the semiconductor dies in the semiconductor die packages 60(a), 60(b).

Figure 4:
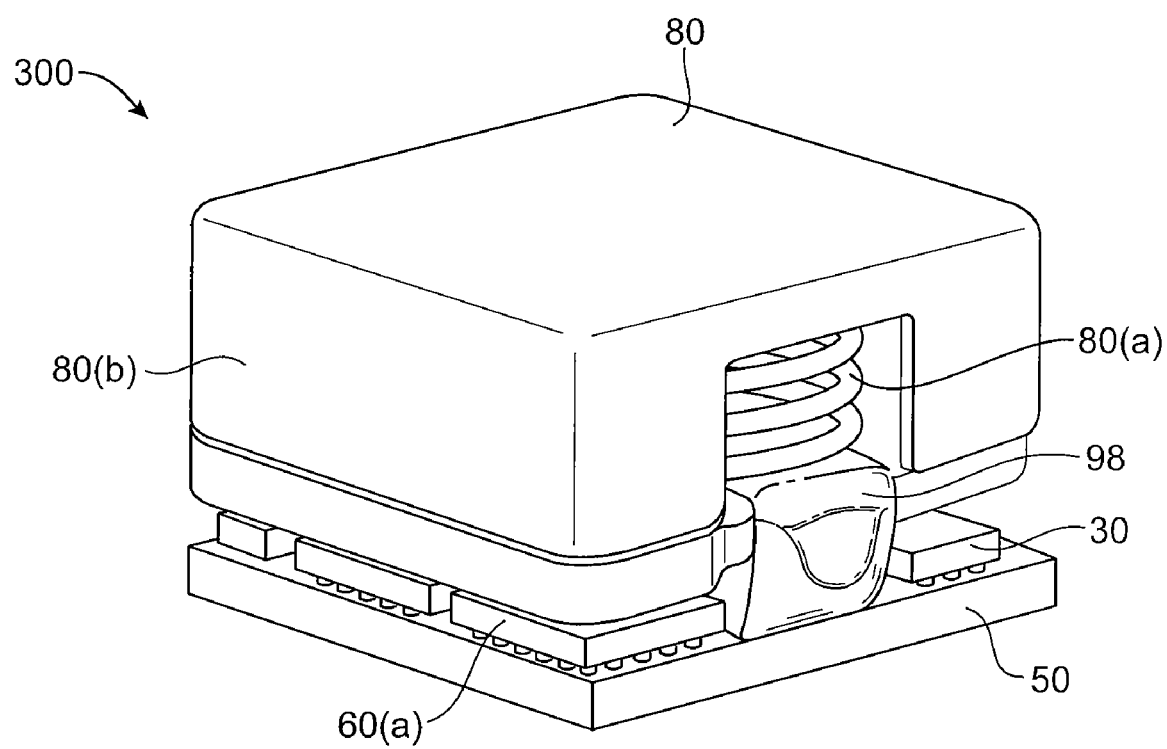
FIG. 4 shows a perspective view of a chip module according to an embodiment of the invention.

FIG. 4 shows a perspective view of a chip module 300 according to an embodiment of the invention. In FIGS. 1 and 4, like numerals designate like elements and the descriptions of like elements apply here. In FIG. 4, the inductor 80 includes a coil 80(a) and a housing 80(b) housing the coil. In this example, a core (not shown) may be present in the coil 80(a). A side conductor 98 may be used to electrically couple the circuit substrate 50 and the coil 80(a). Another side conductor (not shown) may be at the opposite side of the chip module 300 and may connect the coil 80(a) to the circuit substrate 50. The housing 80(b) may be made of a thermally conductive material such as copper or aluminum.

As is apparent from FIG. 4, the chip module 300 is quite compact and has a low profile, even though it contains a number of electrical components and can effectively dissipate heat. As shown in FIG. 4, the height of the chip module 300 is only slightly more than the height of the inductor 80 while the footprint of the chip module 300 is small and substantially corresponds to the lateral dimensions of the inductor 80. For example, the height of the chip module 300 shown in FIG. 4 can be only 1 mm greater than the height of the inductor 80, and the footprint of the chip module 300 is the same as the footprint of the inductor 80. In some embodiments, the chip module 300 may have dimensions of less than about 1 cubic inch, or even 0.5 cubic inches thereby making the chip module 300 suitable for use in electronic apparatuses such as computers.

Because of the efficient component arrangement and improved heat dissipation provided by embodiments of the invention, the power density of the chip module (i.e., Watts per cubic inch) can be more than double that of conventional chip modules. In some embodiments, the chip module can have dimensions of less than 1 cubic inch, and can provide (at least) 350 Watts of power at 1.3 Volts, or (at least) 1500 Watts at 2.6 Volts. Chip modules of similar size without the stacked inductor arrangement described above, would have power densities that are less than about half of these values.

Many of the chip modules of the type shown in FIG. 4 may be used on a motherboard for a personal computer or the like. They may be arranged around a microprocessor that is also mounted on the motherboard. The microprocessor may have a fan or other convectional cooling mechanism on it. The air flow from the fan will further cool the chip modules.

The chip modules according to embodiments of the invention can be formed using any suitable assembly process. In one embodiment, a method for forming a chip module includes obtaining a circuit substrate, mounting a semiconductor die comprising a power transistor on the circuit substrate, and electrically coupling a passive electronic component to the semiconductor die. The passive electronic component is thereafter in thermal communication with the semiconductor die.

Referring to FIG. 1 again, the circuit substrate 50 may first be manufactured or otherwise obtained. Conventional printed circuit board techniques including printing, etching, etc. may be used to form the circuit substrate 50.

Once the circuit substrate 50 is obtained, the various electrical components 30, 60(a), 60(b) may be mounted on the circuit substrate 50 using solder, conductive adhesives, etc. The electrical components may be pre-fabricated and commercially obtained, if desired.

Then, the insulating layer 90 may be placed on top of the mounted electronic components 30, 60(a), 60(b). Pressure may be applied to the insulating layer 90 so that it fills any valleys between the electronic components 30, 60(a), 60(b).

Once the insulating layer 90 is on the electronic components 30, 60(a), 60(b), the inductor 80 may be placed on top of the insulating layer 90. One or more wires (see 98 FIG. 4) or other conductors may then be used to electrically couple the ends of the coil in the inductor 80 to the circuit substrate 50. The chip module 300 may thereafter be formed.

If the solder 40 is not already present on the underside of the circuit substrate 50, then it may be deposited on it and then chip module 300 is thereafter mounted to the motherboard 10. Alternatively, solder may be deposited on the motherboard 10, and the chip module 300 may be mounted to the solder-coated motherboard 10.

Figure 5:
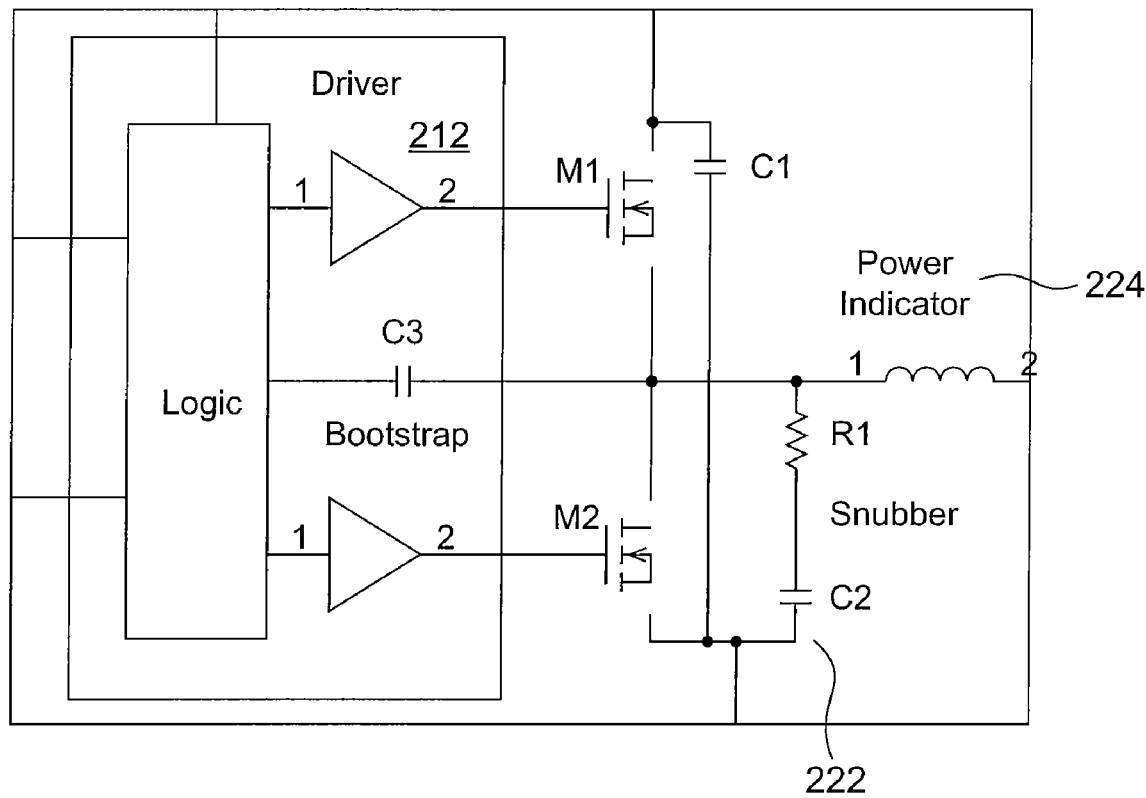
FIG. 5 shows an exemplary circuit that can be implemented using a chip module according to an embodiment of the invention.

FIG. 5 shows an exemplary circuit associated with a synchronous buck converter circuit. All of the components shown in FIG. 5 may be present in a chip module according to an embodiment of the invention. The circuit includes a driver 212 that drives the gates of MOSFETs M1 and M2. The MOSFETs M1 and M2 may be packaged in BGA type packages or other types of packages as described above. The circuit also includes a number of passive components including capacitors C1, C2, C3, and resistor R1. A power inductor 224 is connected to a node that is between the drain of MOS- FET M2 and the source of MOSFET M1. As described above, the power inductor 224 may by stacked on top of MOSFETs M1 and M2.

Although synchronous buck converters are described in detail, the chip modules according to embodiments of the invention can be used in a number of different end applications (push, pull, flyback converters, etc.). Such applications generally use an electronic component including a coil (e.g., an inductor, a transformer, etc.), and at least one switching device. The switching devices are relatively thin and can placed under larger electrical components containing coils.

Embodiments of the invention have a number of other advantages. First, the total footprint of the module is about half that of an identical discrete solution. Second, embodiments of the invention can offer a power density of about 650 Watts per cubic inch for an output voltage of 1.5V at 40 Amps. This is a power density that is unprecedented in the PC arena. Third, placement of the inductor on top of the BGA MOSFETs will result in better thermal performance in an environment with air flow. Fourth, embodiments of the invention provide for a flexible design. Power trains of different topologies may be integrated the same way. Fifth, embodiments of the invention provide for fast customization turn around. Sixth, embodiments of the invention are reflow solderable to motherboards. Seventh, embodiments of the invention may be easily handled by pick and place machines. Eighth, embodiments of the invention are expandable to a large family of modules covering the range from 3-50 Amps to cover all point of load applications within this range.

Any of the above-described embodiments and/or any features thereof may be combined with any other embodiment(s) and/or feature(s) without departing from the scope of the invention.

The above description is illustrative and is not restrictive. Many variations of the invention will become apparent to those skilled in the art upon review of the disclosure. The scope of the invention should, therefore, be determined not with reference to the above description, but instead should be determined with reference to the pending claims along with their full scope or equivalents.

Terms such as "over", "under", "top", "bottom" of the like are used to refer to the specific embodiments as they are illustrated in the Figures. These terms may or may not refer to the absolute positions of various elements in actual embodiments.

A recitation of "a", "an" or "the" is intended to mean "one or more" unless specifically indicated to the contrary.

All patents, patent applications, publications, and descriptions mentioned above are herein incorporated by reference in their entirety for all purposes. None is admitted to be prior art.

What is claimed is:

1. A chip module comprising:
   a circuit substrate having lateral dimensions;
   a semiconductor die comprising a power transistor mounted on the circuit substrate; and
   a passive electronic component stacked on the semiconductor die, and being in electrical and thermal communication with the semiconductor die, the passive electronic component having lateral dimensions that substantially correspond to lateral dimensions of the circuit substrate, wherein the passive electronic component is configured to be exposed to air flow such that it dissipates heat generated by the semiconductor die.

2. The chip module of claim 1 wherein the passive electronic component is an inductor.

3. The chip module of claim 1 further comprising a plurality of solder structures electrically and mechanically coupling the semiconductor die to the circuit substrate.

4. The chip module of claim 1 wherein the power transistor is a power MOSFET.

5. The chip module of claim 1 wherein the semiconductor die is a first semiconductor die, and the power transistor is a first power transistor, and wherein the chip module comprises a second semiconductor die, wherein the second semiconductor die comprises a second power transistor, and wherein the first and second semiconductor dies are present in ball grid array (BGA) type semiconductor die packages.

6. The chip module of claim 5 wherein the chip module forms at least part of a synchronous buck converter circuit.

7. The chip module of claim 1, wherein the passive electronic component is a first passive electronic component and wherein the chip module comprises a second passive electronic component, wherein the second passive electronic component is mounted on the circuit substrate.

8. The chip module of claim 1 further comprising a first set of solder structures disposed between the semiconductor die and a first surface of the circuit substrate, and a second set of solder structures at the second surface of the circuit substrate.

9. The chip module of claim 1 further comprising a resilient, thermally conductive material between the passive electronic component and the semiconductor die.

10. The chip module of claim 9 wherein the resilient, thermally conductive material has elastomeric properties.

11. The chip module of claim 9 wherein the resilient, thermally conductive material is a preformed polymeric layer.

12. An electrical assembly comprising:
    a motherboard; and
    the chip module of claim 1 mounted on the motherboard.

13. The chip module of claim 1 wherein the passive electronic component serves as a heat sink.

14. A chip module comprising:
    a circuit substrate having lateral dimensions;
    a semiconductor die mounted on the circuit substrate; and
    an electronic component comprising a coil stacked on the semiconductor die, and being in electrical and thermal communication with the semiconductor die, the electronic component having lateral dimensions that substantially correspond to the lateral dimensions of the circuit substrate, wherein the electronic component is configured to be exposed to air flow such that it dissipates heat generated by the semiconductor die.

15. The chip module of claim 14 wherein the semiconductor die comprises a power MOSFET and the electronic component is an inductor.

16. The chip module of claim 14 further comprising a plurality of solder structures electrically and mechanically coupling the semiconductor die to the circuit substrate.

17. The chip module of claim 16 wherein the plurality of solder structures are coupled to a first side of the semiconductor die, and further wherein an elastomeric, resilient, and thermally conductive layer couples a second side of the semiconductor die to the electronic component.

18. The chip module of claim 14 wherein the chip module has a height and the electronic component has a height, further wherein the height of the chip module is only slightly more than the height of the electronic component.

19. The chip module of claim 14 wherein the chip module has dimensions of less than 1 cubic inch and can provide at least 350 Watts of power at 1.3 Volts.

* * * * *